United States Patent [19]

Motley et al.

[11] Patent Number: 5,467,038
[45] Date of Patent: Nov. 14, 1995

[54] QUICK RESOLVING LATCH

[75] Inventors: Gordon W. Motley; Peter J. Meier; Brian C. Miller, all of Ft. Collins, Colo.

[73] Assignee: Hewlett-Packard Company, Palo Alto, Calif.

[21] Appl. No.: 196,327

[22] Filed: Feb. 15, 1994

[51] Int. Cl.$^6$ .................................................. H03K 3/356
[52] U.S. Cl. ...................... 327/185; 327/199; 327/208; 327/202
[58] Field of Search .................................. 327/185, 199, 327/200, 201, 202, 203, 208, 209, 210, 211, 212, 214, 215, 218; 365/154

[56] References Cited

U.S. PATENT DOCUMENTS

| 4,569,067 | 2/1986 | Gallup | 327/203 |
|---|---|---|---|
| 4,644,185 | 2/1987 | Todd | 327/199 |
| 4,768,172 | 8/1988 | Sasaki | 365/154 |
| 4,777,623 | 10/1988 | Shimazu et al. | 365/154 |
| 5,264,738 | 11/1993 | Veendrick et al. | 327/203 |

FOREIGN PATENT DOCUMENTS

| 4038007 | 2/1992 | Japan | 327/203 |
|---|---|---|---|
| 4216212 | 8/1992 | Japan | 327/211 |
| 4306910 | 10/1992 | Japan | 327/208 |
| 5014139 | 1/1993 | Japan | 327/208 |
| 5037305 | 2/1993 | Japan | 327/208 |

OTHER PUBLICATIONS

Veendrick, Harry J. M., "The Behavior of Flip–Flops Used as Synchronizers & Prediction of Their Failure Rate", IEEE Journal of Solid-State Circuits, vol. SC-15, No. 2, Apr. 1980.

Primary Examiner—Timothy P. Callahan
Assistant Examiner—Eunja Shin

[57] ABSTRACT

A CMOS latch circuit having a second feedback inverter and a switching circuit to switch the second feedback inverter out of the circuit when the latch is being loaded. A first circuit implementation uses a single PFET as the switching circuit, and a second circuit implementation incorporates an NFET transistor, in parallel with the PFET. In a third circuit implementation, the switching circuit switches power to and from the second feedback inverter rather than switching the output signal of the inverter to reduce the input capacitance of the latch.

20 Claims, 4 Drawing Sheets

QUICK RESOLVING LATCH

FIELD OF THE INVENTION

This invention relates to electronic circuits and more particularly to integrated electronic circuits. Even more particularly, the invention relates to a latch circuit using three inverter circuits.

BACKGROUND OF THE INVENTION

Latches in digital circuits can be formed in many ways, however, one common way to create a latch within CMOS integrated circuits is to use a pair of inverters connected back to back, as shown in FIG. 1. As the circuit of FIG. 1 shows, when control signal 106 is high, it enables NFET 108, which connects data signal 104 to the input of inverter 110. Inverter 110 inverts the signal on its input to produce an output signal 116, which is inverted again by inverter 112 as a feedback signal to cause the circuit to latch. Inverter 110 is called the feed-forward inverter, and inverter 112 is called the feedback inverter.

For the circuit of FIG. 1 to work properly, the feedback inverter 112 must be a smaller inverter, thus having a weaker drive output, then the feed-forward inverter 110. This is necessary so that the data 104 can overdrive the input signal 114 to force the input 114 into the correct state in order to change the latch from one state to another. If the feedback inverter 112 is too weak, however, the circuit may be unstable.

There are two important characteristics of such a latch, gain and resolving time. Gain, of course, determines how much input signal is required to cause the inverter to invert the input signal to produce an inverted output signal. The resolving time, $\tau$, is a point at which the output equals sixty-three percent of its original value. The two primary effects on $\tau$ are the gain of the circuit and the capacitance of the circuit, wherein the smaller the gain and the larger the capacitance the slower the circuit will resolve. The gain can be improved by putting more strength into the feedback loop. At some point, however, the feedback inverter 112 becomes so strong that it cannot be overdriven by the data signal 104 in order to change the state of the latch.

There is need in the art then for a method of creating a latch circuit with a stronger feedback signal to improve the resolving time, while still allowing the feedback signal to be overdriven by input data. The present invention meets this and other needs in the prior art.

SUMMARY OF THE INVENTION

It is an aspect of the present invention to provide a latch circuit that resolves quickly.

It is another aspect of the invention to provide such a latch circuit using two feedback inverter circuits.

Another aspect is to switch the output of one feedback inverter circuit out of the system when data is being loaded into the latch.

The above and other aspects of the invention are accomplished in a latch circuit that includes a conventional feed-forward inverter and a feedback inverter while adding a second feedback inverter and a switching circuit to switch the second feedback inverter in or out of the circuit at appropriate times. The second feedback inverter is gated by the control signal that gates input data into the latch to change the state of the latch. That is, when the control signal is activated to gate data into the latch, the same control signal disconnects the output of the second feedback inverter. The second inverter is stronger than the first feedback inverter, so when the second feedback inverter is switched out of the system, the first feedback inverter is left in the circuit to maintain the state of the latch, however, being weaker, the first feedback inverter can be easily overdriven by the input signal. When the control signal is deactivated, the switching circuit connects the output of the stronger inverter to increase gain and allow the circuit to easily maintain the latched condition.

In a first embodiment of the invention, the switching circuit comprises a single PFET transistor with the control signal connected to its gate. Because PFET are better at passing high values, a second embodiment incorporates an NFET transistor, in parallel with the PFET, with its gate connected to an inverted control signal. Thus, in this second embodiment both a PFET and an NFET in parallel switch the output of the stronger inverter into and out of the circuit.

In a third embodiment of the invention, the switching circuit switches power to and from the second feedback inverter rather than switching its output signal. In this embodiment, since the switching circuit is not connected to the input signal, the capacitance of the switching circuit does not affect the input capacitance of the latch, thus improving resolving time of the latch.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
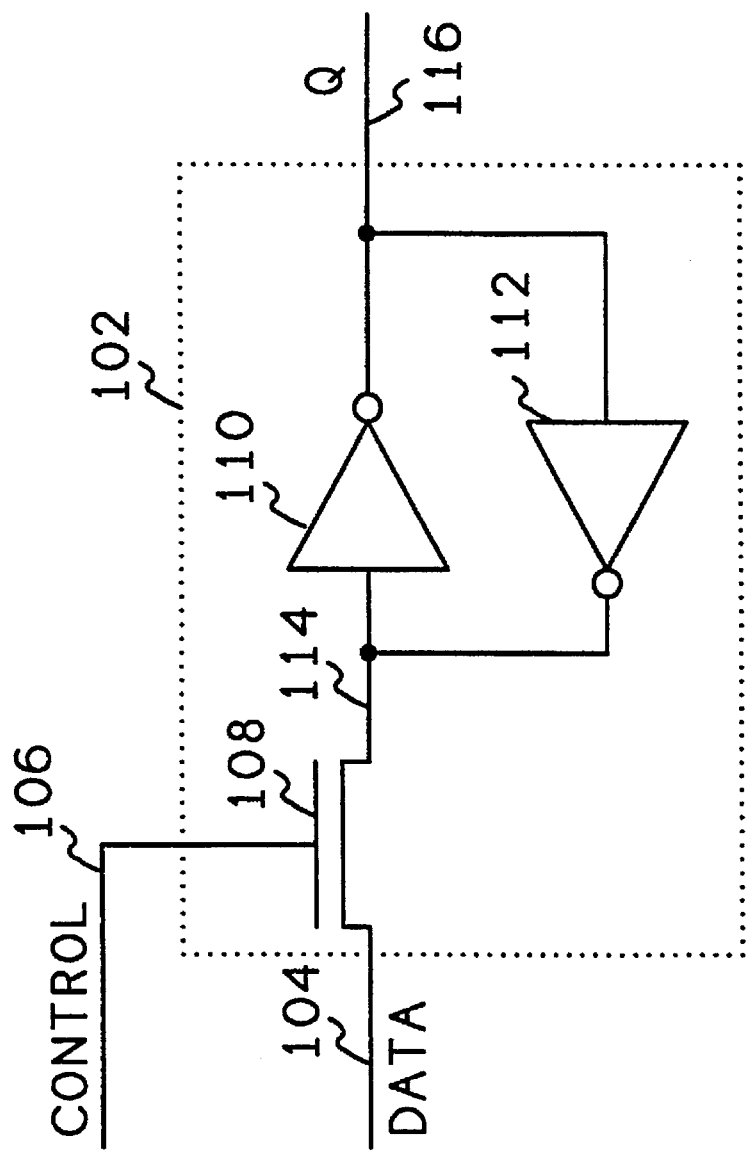
FIG. 1 shows a prior art latch circuit.

FIG. 1 shows a prior art latch circuit. Referring now to FIG. 1, a feed-forward inverter 110 is connected in parallel to a feedback inverter 112. When control signal 106 is active, high, it enables NFET 108, which connects data signal 104 to the input 114 of inverter 110. Inverter 110 inverts the signal on its input to produce an output signal 116, which is reinverted by inverter 112 as a feedback signal to cause the circuit to latch.

For the circuit of FIG. 1 to work properly, the feedback inverter 112 must be smaller, thus having a weaker drive output, then the feed-forward inverter 110. This is necessary so that the input data signal 104 can overdrive the input 114 to the inverter 110, in order to change the latch from one state to another.

Figure 2:
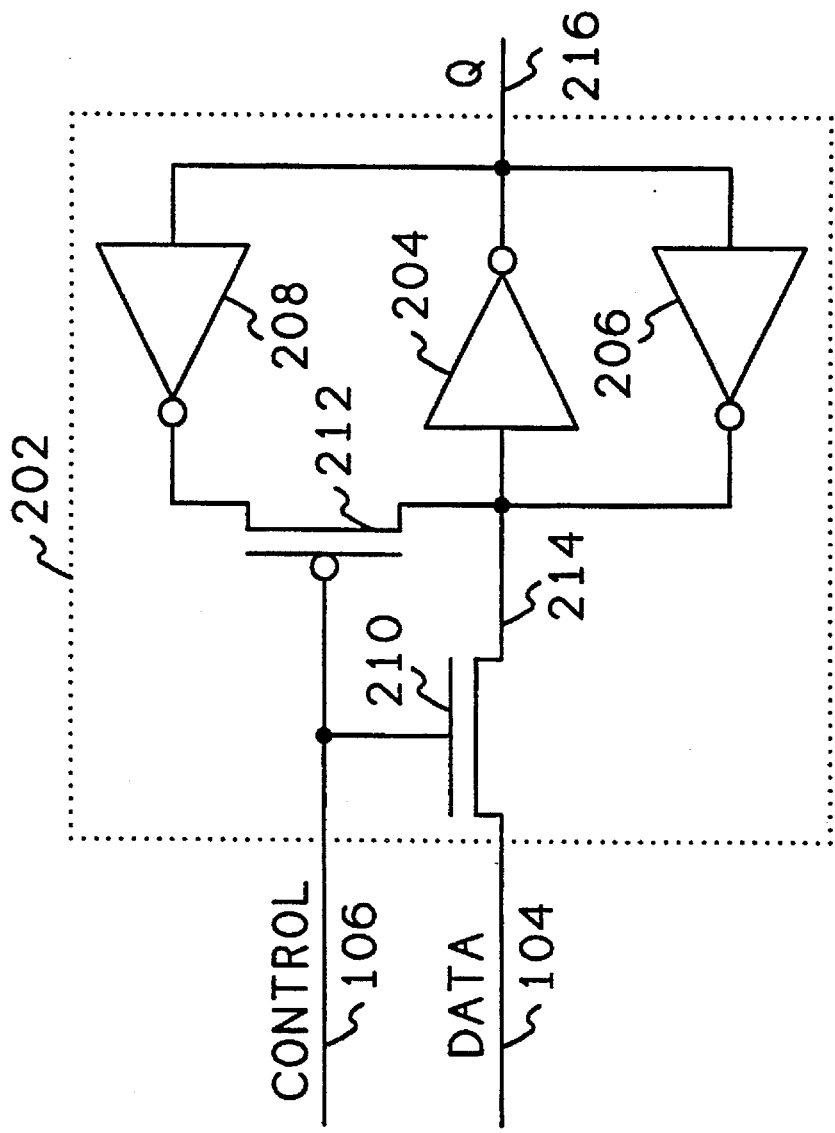
FIG. 2 shows a first embodiment of the present invention using a second feedback inverter and a PFET transistor to switch the second feedback circuit into and out of the circuit.

FIG. 2 shows a first embodiment of the invention. Referring now to FIG. 2, the latch 202 of the present invention contains a feed-forward inverter 204 and a weak feedback inverter 206. An NFET transistor 210 is turned on or off by control signal 106 to gate or de-gate data 104 to the input 214 of the feed-forward inverter 204. A second feedback inverter 208 is connected to feed the output 216 of the feed-forward inverter 204 back through a switching circuit, comprising transistor 212, to the input of feed-forward inverter 204. When control signal 106 is activated, it turns transistor 210 on and transistor 212 off, thus, while control signal 106 is active, the latch functions in the same manner as the prior art latch of FIG. 1. That is, a signal on data input 104 is connected to input 214 of feed-forward inverter 204, which inverts the data input signal 104 to produce the output 216. The output signal 216 is connected to the input of the weak feedback inverter 206 whose output is connected back to the input of inverter 204. Because of the low output power drive of the weak inverter 206, the data 104 is able to overdrive the output of the weak inverter 206 to allow the latch circuit to change state.

When control signal 106 is deactivated, transistor 212 is turned on connecting the output of the strong inverter 208 to the input 214 of the feed-forward inverter 204, thus providing additional gain in the circuit to improve resolving time. In practice, the combined output drive strengths of the weak feedback inverter 206 and the strong feedback inverter 208 are approximately equal to the strength of the feed-forward inverter 204, thus, providing a stable latch. The strength of these inverters is determined by the size of the transistors comprising the inverters, thus, the combined size of inverter 206 and inverter 208 is approximately the same as the size of the transistors comprising inverter 204.

Connecting the second feedback inverter into the circuit improves the gain of the circuit, and therefore improves the resolving time of the circuit.

Figure 3:
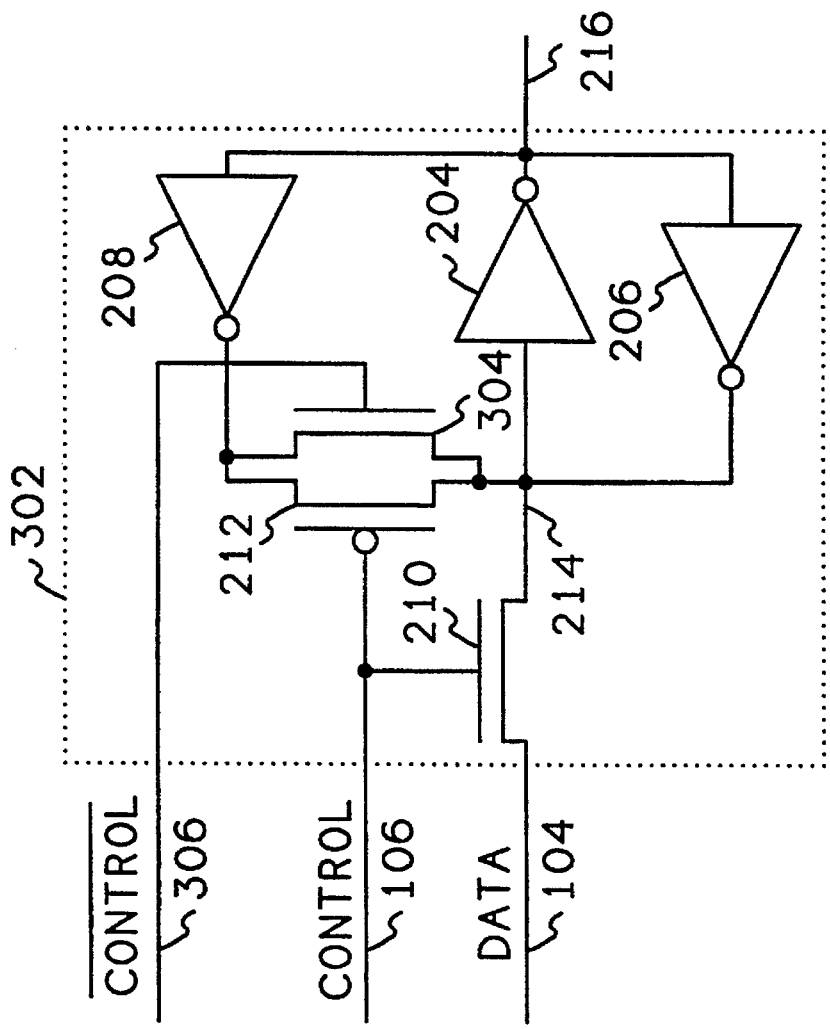
FIG. 3 shows a second embodiment of the invention using an additional NFET transistor in the switching circuit.

Because PFET transistors are good at passing high values, but not as good as NFET transistors at passing low values, the circuit of FIG. 2 can be improved. FIG. 3 shows such an improved circuit having an NFET transistor 304 connected in parallel to the PFET transistor 212. The gate of NFET transistor 304 is connected to an inverted control signal 306 for proper activation. Having the NFET transistor 304 in parallel with the PFET transistor 212 ensures that both states of the latch are easily passed through the switching system to the input 214 of the feed-forward inverter 204.

When the switching system comprising transistors 304 and 212 is turned on, they act like a resistor between the output of the strong inverter 208 and the input 214 of the feed-forward inverter 204. Because these transistors act like resistors, they need to be large in size to create a lower resistance value. Therefore, they are designed to be approximately the same size as the transistors in the feed-forward inverter, however, those skilled in the art will recognize that they do not need to be exactly the same size as the feed-forward transistors.

Figure 4:
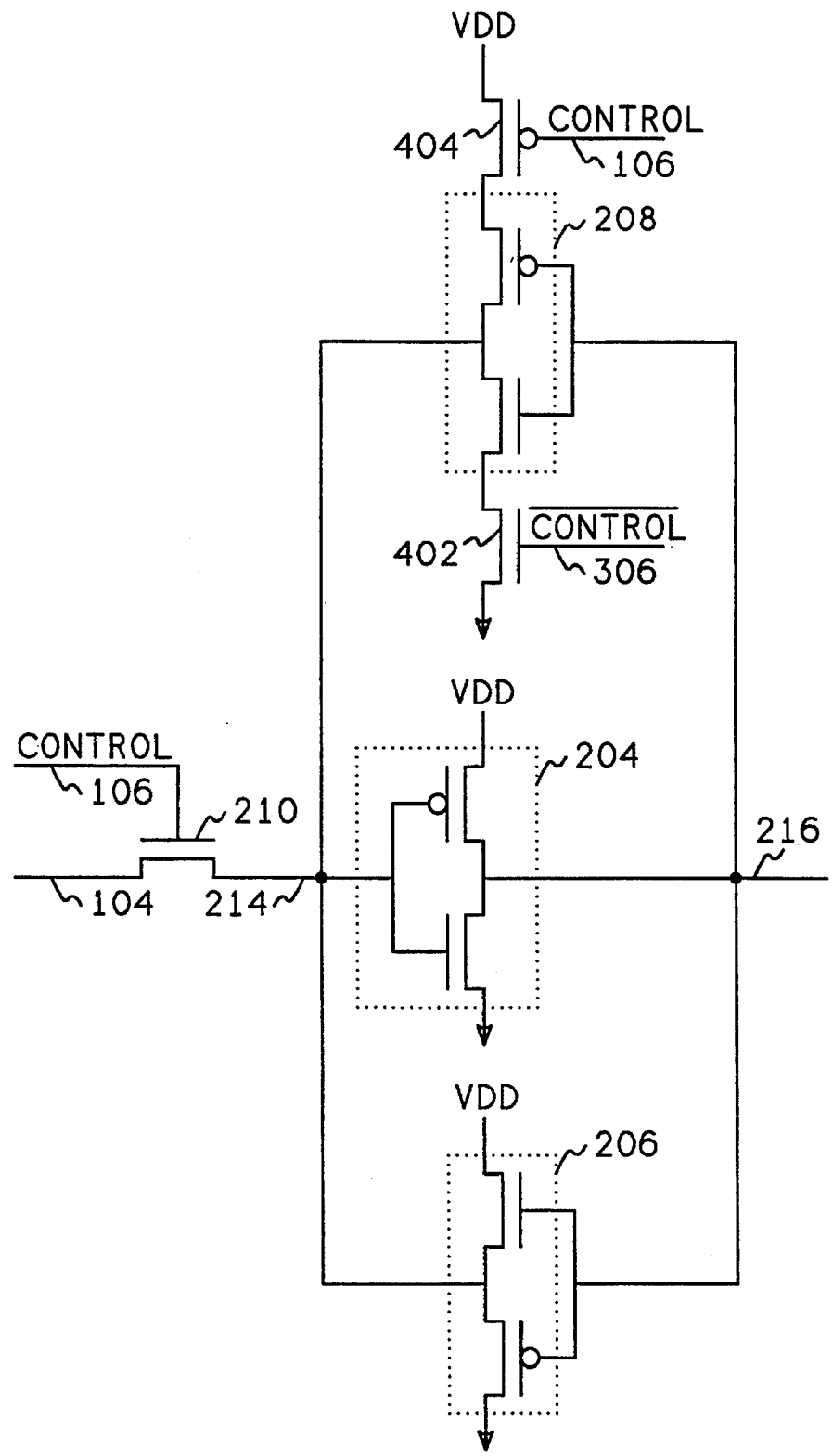
FIG. 4 shows a third embodiment of the invention wherein the switching circuit switches power to the second feedback inverter.

As discussed above, the resolving time of the latch is a function of the gain of the circuit, but also a function of the input capacitance to the latch. Because of the location of the switching transistors 304 and 212, the capacitance of these transistors affects the input capacitance of the latch. FIG. 4 shows a third embodiment of the invention which removes the capacitance of the switching transistors from the input of the latch circuit. Referring now to FIG. 4, FIG. 4 is shown in schematic diagram illustrating all the transistors of the circuit. The feed-forward inverter 204 and the weak feedback inverter 206 are drawn as standard CMOS inverter circuits. The strong feedback inverter 208 is also a standard CMOS inverter circuit, however, the switching transistors are not connected in series with its output. Instead, the switching transistors 402 and 404 are connected between the strong inverter 208 and power and ground. When the control signals 106 and 306 are activated, they remove power from the transistors comprising the strong feedback inverter 208. This has the same effect as the circuit of FIG. 3, by removing the drive capability of the strong feedback inverter 208. However, since the switching transistors 402 and 404 are not connected to the signal 214, no capacitance effect is seen on the signal 214, thus, the resolving time of the latch is improved. In this circuit, the size of the transistors 402 and 404 is determined by the power requirements of the strong feedback inverter 208.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A latch circuit for storing data in a digital circuit, said latch circuit comprising:

a feed-forward inverter circuit;

a first feedback inverter circuit having an input connected to an output of said feed-forward inverter circuit and having an output connected to an input of said feed-forward inverter circuit;

control means for connecting an input signal to said input of said feed-forward inverter circuit;

a second feedback inverter connected in parallel to said first feedback inverter; and switching means having an input connected to said control means, said switching means connected to switch said second feedback inverter out of said latch circuit when said control means is activated to connect said input signal to said input of said feed-forward inverter circuit.

2. The latch circuit of claim 1 wherein said switching means comprises a single transistor.

3. The latch circuit of claim 1 wherein said switching means comprises a pair of complementary transistors connected in parallel.

4. The latch circuit of claim 3 wherein said complementary transistors comprise a PFET transistor and an NFET transistor.

5. The latch circuit of claim 1 wherein said switching means comprises means for switching a power supply of said second feedback inverter, wherein electrical power is removed from said second feedback inverter when said second feedback inverter is switched out of said latch circuit.

6. The latch circuit of claim 5 wherein said means for switching comprises a PFET transistor connected between a positive supply voltage and said second feedback inverter and an NFET transistor connected between said second feedback inverter and ground, wherein said control means is connected to cut off said PFET transistor and said NFET transistor when said control means is activated.

7. The latch circuit of claim 1 wherein a combined size of transistors comprising said first feedback inverter and transistors comprising said second feedback inverter is substantially equal to a size of transistors comprising said feed-forward inverter.

8. The latch circuit of claim 1 wherein a size of transistors comprising said first feedback inverter is substantially less than a size of transistors comprising said feed-forward inverter.

9. The latch circuit of claim 8 wherein a size of transistors comprising said second feedback inverter is substantially larger than a size of transistors comprising said first feedback inverter.

10. A latch circuit for storing data in a digital circuit, said latch circuit comprising:

a feed-forward inverter circuit;

a first feedback inverter circuit having an input connected to an output of said feed-forward inverter circuit and having an output connected to an input of said feed-forward inverter circuit;

control means for connecting an input signal to said input of said feed-forward inverter circuit;

a second feedback inverter connected in parallel to said first feedback inverter; and switching means having an input connected to said control means, said switching means for switching a power supply of said second feedback inverter, wherein electrical power is removed from said second feedback inverter when said control means is activated to connect said input signal to said input of said feed-forward inverter circuit.

11. The latch circuit of claim 10 wherein said switching means comprises a PFET transistor connected between a positive supply voltage and said second feedback inverter and an NFET transistor connected between said second feedback inverter and ground, wherein said control means is connected to cut off said PFET transistor and said NFET transistor when said control means is activated.

12. The latch circuit of claim 10 wherein a combined size of transistors comprising said first feedback inverter and transistors comprising said second feedback inverter is substantially equal to a size of transistors comprising said feed-forward inverter.

13. The latch circuit of claim 10 wherein a size of transistors comprising said first feedback inverter is substantially less than a size of transistors comprising said feed-forward inverter.

14. The latch circuit of claim 13 wherein a size of transistors comprising said second feedback inverter is substantially larger than a size of transistors comprising said first feedback inverter.

15. A latch circuit for storing data in a digital circuit, said latch circuit comprising:

a feed-forward inverter circuit;

a first feedback inverter circuit having an input connected to an output of said feed-forward inverter circuit and having an output connected to an input of said feed-forward inverter circuit;

control means for connecting an input signal to said input of said feed-forward inverter circuit;

a second feedback inverter connected in parallel to said first feedback inverter; and switching means having an input connected to said control means, said switching means connected to switch an output signal of said second feedback inverter out of said latch circuit when said control means is activated to connect said input signal to said input of said feed-forward inverter circuit.

16. The latch circuit of claim 15 wherein said switching means comprises a single transistor.

17. The latch circuit of claim 15 wherein said switching means comprises a pair of complementary transistors connected in parallel.

18. The latch circuit of claim 17 wherein said complementary transistors comprise a PFET transistor and an NFET transistor.

19. The latch circuit of claim 15 wherein a size of transistors comprising said first feedback inverter is substantially less than a size of transistors comprising said feed-forward inverter.

20. The latch circuit of claim 19 wherein a size of transistors comprising said second feedback inverter is substantially larger than a size of transistors comprising said first feedback inverter.

* * * * *